United States Patent
Best et al.

(10) Patent No.: US 11,527,302 B2
(45) Date of Patent: Dec. 13, 2022

(54) BUFFER CIRCUIT WITH ADAPTIVE REPAIR CAPABILITY

(71) Applicant: Rambus Inc., San Jose, CA (US)

(72) Inventors: Scott C. Best, Palo Alto, CA (US); John Eric Linstadt, Palo Alto, CA (US); Paul William Roukema, Waterloo (CA)

(73) Assignee: Rambus Inc., San jose, CA (US)

( * ) Notice: Subject to any disclaimer, the term of this patent is extended or adjusted under 35 U.S.C. 154(b) by 0 days.

(21) Appl. No.: 17/368,018

(22) Filed: Jul. 6, 2021

(65) Prior Publication Data

US 2022/0005542 A1 Jan. 6, 2022

Related U.S. Application Data

(63) Continuation of application No. 16/537,021, filed on Aug. 9, 2019, now Pat. No. 11,069,423, which is a
(Continued)

(51) Int. Cl.
*G11C 29/00* (2006.01)
*G11C 29/44* (2006.01)
(Continued)

(52) U.S. Cl.
CPC ............ *G11C 29/4401* (2013.01); *G11C 5/04* (2013.01); *G11C 11/401* (2013.01);
(Continued)

(58) Field of Classification Search
CPC ....... G11C 29/4401; G11C 29/52; G11C 5/04; G11C 29/783; G11C 29/76;
(Continued)

(56) References Cited

U.S. PATENT DOCUMENTS 5,477,492 A 12/1995 Ohsaki et al.
5,652,725 A 7/1997 Suma et al.
(Continued)

FOREIGN PATENT DOCUMENTS

WO WO-2012-170154 A1 12/2012

OTHER PUBLICATIONS

Notification of Transmittal of the International Search Report and the Written Opinion of the International Searching Authority or the Declaration dated Jan. 27, 2016 re Int'l Appln. No. PCT/US15/045495. 11 Pages.

*Primary Examiner* — Esaw T Abraham
(74) *Attorney, Agent, or Firm* — Lance Kreisman; Peninsula Patent Group (57) ABSTRACT

A buffer circuit is disclosed. The buffer circuit includes a command address (C/A) interface to receive an incoming activate (ACT) command and an incoming column address strobe (CAS) command. A first match circuit includes first storage to store failure row address information associated with the memory, and first compare logic. The first compare logic is responsive to the ACT command, to compare incoming row address information to the stored failure row address information. A second match circuit includes second storage to store failure column address information associated with the memory, and second compare logic. The second compare logic is responsive to the CAS command, to compare the incoming column address information to the stored failure column address information. Gating logic maintains a state of a matching row address identified by the first compare logic during the comparison carried out by the second compare logic.

20 Claims, 11 Drawing Sheets

Related U.S. Application Data continuation of application No. 15/506,621, filed as application No. PCT/US2015/045495 on Aug. 17, 2015, now Pat. No. 10,388,396.

(60) Provisional application No. 62/041,489, filed on Aug. 25, 2014.

(51) Int. Cl.
- *G11C 5/04* (2006.01)
- *G11C 11/401* (2006.01)
- *G11C 29/02* (2006.01)
- *G11C 29/52* (2006.01)

(52) U.S. Cl.
CPC ............ *G11C 29/022* (2013.01); *G11C 29/52* (2013.01); *G11C 29/76* (2013.01); *G11C 29/783* (2013.01); *G11C 29/88* (2013.01); *G11C 2029/4402* (2013.01)

(58) Field of Classification Search
CPC .......... G11C 2029/0409; G11C 29/838; G11C 29/88; G11C 29/022; G11C 2029/401
See application file for complete search history.

(56) References Cited

U.S. PATENT DOCUMENTS

| | | | | |
|---|---|---|---|---|
| 5,758,056 | A * | 5/1998 | Barr ...................... | G11C 29/76 714/6.32 |
| 6,070,232 | A | 5/2000 | Ishida et al. | |
| 6,243,307 | B1 | 6/2001 | Kawagoe | |
| 6,636,446 | B2 | 10/2003 | Lee et al. | |
| 6,646,930 | B2 | 11/2003 | Takeuchi et al. | |
| 6,714,466 | B2 | 3/2004 | Park et al. | |
| 7,061,799 | B2 | 6/2006 | Kawai et al. | |
| 7,149,945 | B2 | 12/2006 | Brueggen | |
| 7,165,153 | B2 | 1/2007 | Vogt | |
| 7,181,643 | B2 | 2/2007 | Kaiser et al. | |
| 7,327,590 | B2 | 2/2008 | Matsui et al. | |
| 7,376,012 | B2 | 5/2008 | Kawamoto et al. | |
| 7,379,361 | B2 | 5/2008 | Co et al. | |
| 7,401,269 | B2 | 7/2008 | Hoda et al. | |
| 7,475,316 | B2 | 1/2009 | Cowell et al. | |
| 7,548,444 | B2 | 6/2009 | Matsui et al. | |
| 7,584,336 | B2 * | 9/2009 | Tremaine ............ | G06F 13/1684 711/170 |
| 7,663,950 | B2 * | 2/2010 | Moogat ................ | G11C 29/846 365/189.05 |
| 7,818,626 | B1 | 10/2010 | Tsien et al. | |
| 7,934,052 | B2 * | 4/2011 | Prins ...................... | G06F 13/28 711/E12.008 |
| 7,965,531 | B2 | 6/2011 | Matsui et al. | |
| 8,072,827 | B2 | 12/2011 | Wakimoto | |
| 8,108,607 | B2 | 1/2012 | Shaeffer et al. | |
| 8,195,978 | B2 * | 6/2012 | Flynn .................. | G06F 11/1008 714/6.1 |
| 8,245,087 | B2 | 8/2012 | Abts et al. | |
| 8,245,105 | B2 | 8/2012 | Dell et al. | |
| 8,386,833 | B2 | 2/2013 | Smith et al. | |
| 8,473,791 | B2 | 6/2013 | Shaw et al. | |
| 8,522,072 | B2 | 8/2013 | Huang | |
| 8,522,122 | B2 | 8/2013 | Alves et al. | |
| 8,527,828 | B2 | 9/2013 | Markison et al. | |
| 8,542,544 | B2 | 9/2013 | Komatsu et al. | |
| 8,687,444 | B2 | 4/2014 | Ide et al. | |
| 8,854,854 | B2 | 10/2014 | Matsui et al. | |
| 9,015,552 | B2 | 4/2015 | Bates et al. | |
| 9,384,821 | B2 | 7/2016 | Bains et al. | |
| 9,721,641 | B2 | 8/2017 | Bains | |
| 9,922,728 | B2 | 3/2018 | Park et al. | |
| 11,119,857 | B2 * | 9/2021 | Sikdar .................. | G06F 11/106 |
| 2006/0109715 | A1 | 5/2006 | Lee et al. | |
| 2011/0228620 | A1 | 9/2011 | Chou | |
| 2012/0281348 | A1 | 11/2012 | Harashima et al. | |
| 2013/0058145 | A1 | 3/2013 | Yu et al. | |
| 2013/0182489 | A1 | 7/2013 | Wang | |
| 2013/0198587 | A1 | 8/2013 | Kim et al. | |
| 2014/0082453 | A1 | 3/2014 | Sikdar et al. | |
| 2014/0140153 | A1 | 5/2014 | Son et al. | |

* cited by examiner

BUFFER CIRCUIT WITH ADAPTIVE REPAIR CAPABILITY

CROSS REFERENCES TO RELATED APPLICATIONS

This application is a Continuation application of U.S. application Ser. No. 16/537,021, filed Aug. 9, 2019, titled "BUFFER CIRCUIT WITH ADAPTIVE REPAIR CAPABILITY", now U.S. Pat. No. 11,069,423, which issued on Jul. 20, 2021, which is a Continuation application of U.S. application Ser. No. 15/506,621, filed Feb. 24, 2017, titled "BUFFER CIRCUIT WITH ADAPTIVE REPAIR CAPABILITY", now U.S. Pat. No. 10,388,396, which issued on Aug. 19, 2019, which is a national stage application of international application number PCT/US2015/045495, filed Aug. 17, 2015, which claims the benefit of U.S. Provisional Application No. 62/041,489, filed Aug. 25, 2014, all of which are incorporated by reference herein in their entireties.

TECHNICAL FIELD

The disclosure herein relates to memory systems, and more specifically to on-module memory repair apparatus and methods.

BACKGROUND

Memory modules come in a variety of configurations depending on a given application and desired storage capacity. For high-capacity memory modules that employ significant numbers of memory devices, a buffered architecture is often employed. The buffered approach buffers data transferred between the memory devices and a memory controller, thus reducing loading of a data bus to the relatively few buffer devices, rather than the high number of memory devices. Address and control busses are also typically buffered in these systems.

Employing increasing numbers of memory devices on conventional high-capacity memory modules exposes the overall memory to a cumulative yield problem. A significant percentage of conventional memory modules may develop permanent failures at the memory device level after operating in the field for a relatively short duration. Replacing individual devices on a module is generally impractical, resulting in an entire module replacement if the number of failures significantly impact the performance or capacity of the overall memory.

BRIEF DESCRIPTION OF THE DRAWINGS

Embodiments of the disclosure are illustrated by way of example, and not by way of limitation, in the figures of the accompanying drawings and in which like reference numerals refer to similar elements and in which.

DETAILED DESCRIPTION

Embodiments of integrated circuits, memory modules and associated methods are disclosed herein. One embodiment of a buffer circuit for a memory includes a command address (C/A) interface to receive an incoming activate (ACT) command and an incoming column address strobe (CAS) command. The ACT command includes incoming row address information for a given data transfer involving the memory and the CAS command includes incoming column address information for the data transfer. A first match circuit includes first storage to store failure row address information associated with the memory, and first compare logic. The first compare logic is responsive to the ACT command, to compare incoming row address information to the stored failure row address information. A second match circuit includes second storage to store failure column address information associated with the memory, and second compare logic. The second compare logic is responsive to the CAS command, to compare the incoming column address information to the stored failure column address information. Gating logic maintains a state of a matching row address identified by the first compare logic during the comparison carried out by the second compare logic. Employing multiple match circuits in this manner enables an efficient way to search incoming address information against known defective storage locations with minimal storage resources in the match circuits. This allows redirecting data associated with a defective storage location to a repair resource in the buffer circuit. The buffer circuit thus provides repair capability while operating in the field, thereby minimizing wholesale memory module replacements for failures at the memory device level.

In a further embodiment, a method of operation in a buffer circuit is disclosed. The method includes receiving an incoming activate (ACT) command and an incoming column address strobe (CAS) command. The ACT command includes incoming row address information for a given data transfer involving the memory and the CAS command includes incoming column address information for the data transfer. Failure row address information associated with the memory is stored in a first match circuit. The incoming row address information is compared to the stored failure row address information in response to the ACT command, to generate row match information. Failure column address information associated with the memory is stored in a second match circuit. The incoming column address information is compared to the stored failure column address information in response to the CAS command. A state of a matching row address identified in the generated row match information is maintained during the second comparing.

In yet another embodiment, a memory module is disclosed. The memory module includes a substrate, and multiple memory devices disposed on the substrate. Buffer circuitry is disposed on the substrate and is coupled to the memory devices. The buffer circuitry includes a command address (C/A) interface to receive an incoming activate (ACT) command and an incoming column address strobe (CAS) command. The ACT command includes incoming row address information for a given data transfer involving the memory and the CAS command includes incoming column address information for the data transfer. A first match circuit includes first storage to store failure row address information associated with the memory, and first compare logic. The first compare logic is responsive to the ACT command, to compare incoming row address information to the stored failure row address information. A second match circuit includes second storage to store failure column address information associated with the memory, and second compare logic. The second compare logic is responsive to the CAS command, to compare the incoming column address information to the stored failure column address information. Gating logic maintains a state of a matching row address identified by the first compare logic during the comparison carried out by the second compare logic.

Figure 1:
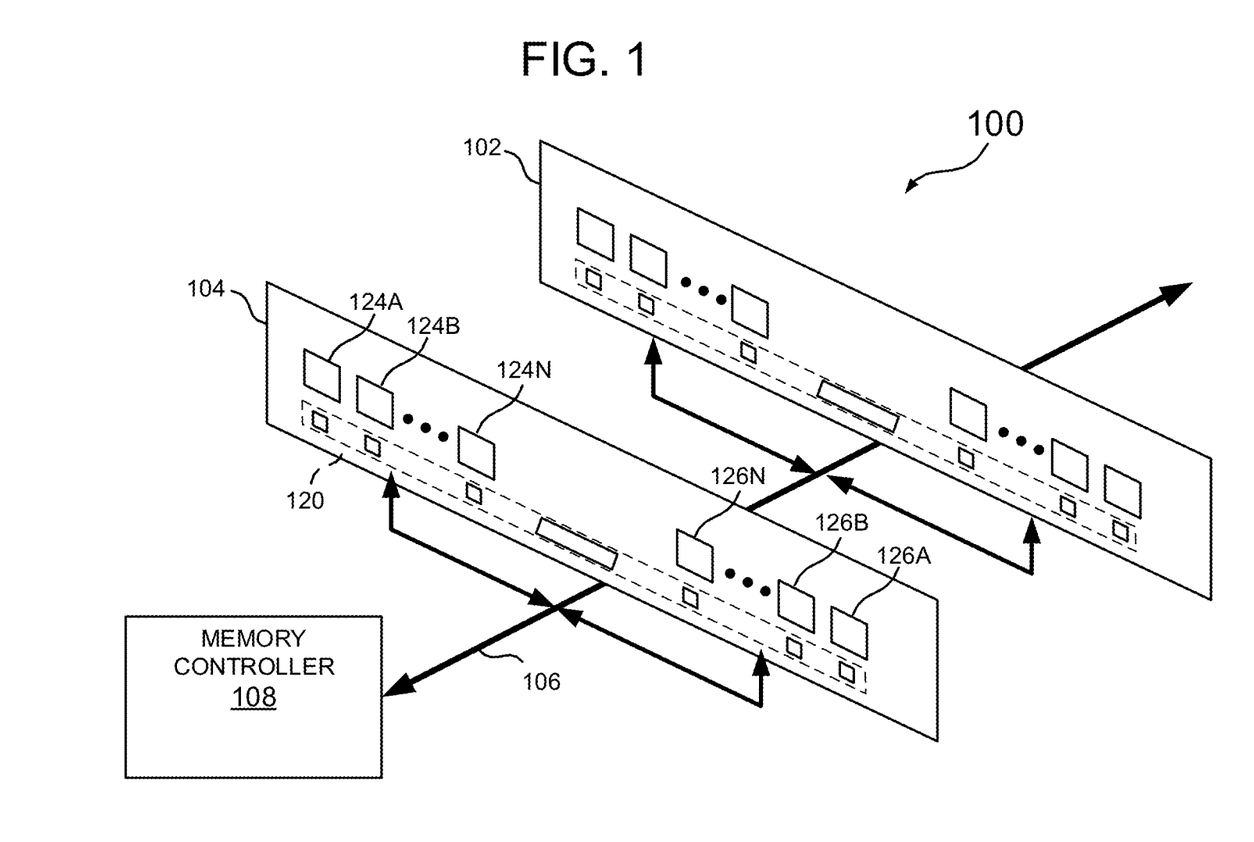
FIG. 1 illustrates one embodiment of a memory system that employs a memory controller and multiple memory modules.

Referring to FIG. 1, one embodiment of a buffered memory architecture, generally designated 100, employs multiple memory modules 102 and 104 coupled to a primary bus 106 that transfers data, command and address signals. Memory control circuitry in the form of a memory controller 108 is also coupled to the primary bus 106 to direct data transfers to and from the modules 102 and 104. The memory control circuitry may include, e.g., a discrete memory controller separate from a requestor integrated circuit (IC). For one embodiment, the memory controller is an IC chip that controls dynamic random access memory (DRAM) devices disposed on the modules 102 and 104.

Further referring to FIG. 1, the embodiment shown illustrates a multi-drop bus, where the primary bus 106 is shared by the modules 102 and 104. Point-to-point topologies are also envisioned, but not illustrated. Each module includes buffer circuitry 120, described more fully below, and memory devices 124A-124N and 126A-126N. For one embodiment, the memory devices are DRAM devices. The buffer circuit 120 isolates the memory devices from the primary bus 106 for each module. Thus, instead of the multiple memory devices for each module loading the bus, only the buffer circuits load the bus. This minimizes capacitive loading on the shared primary bus, among other things. As explained more fully below, the buffer circuit 120 may also employ memory repair logic to adaptively repair memory device failures detected in memory devices on the module.

Figure 2:
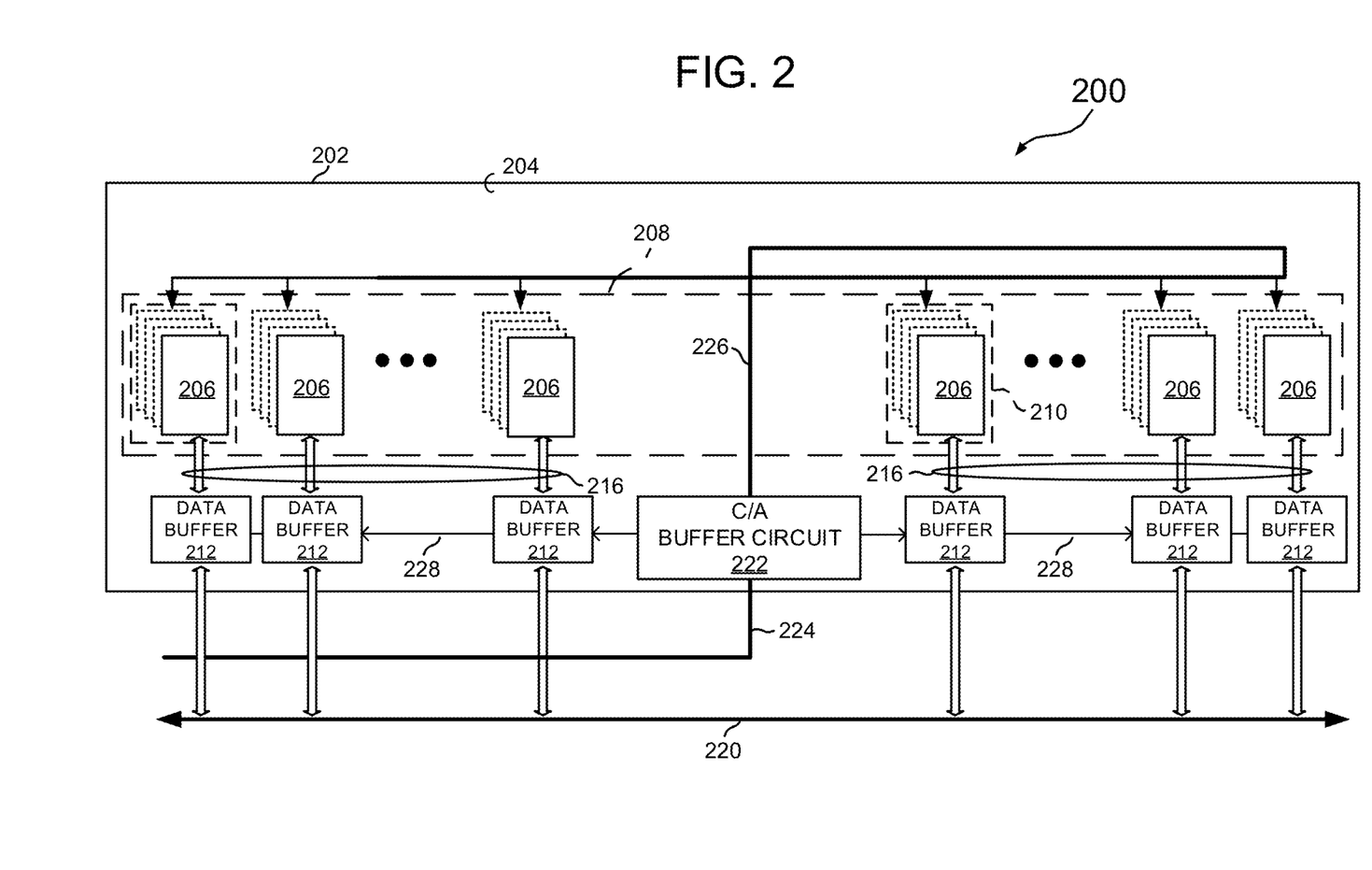
FIG. 2 illustrates one embodiment of a buffered memory module that may be used with the memory system of FIG. 1.

FIG. 2 illustrates additional detail for one embodiment of a memory module, generally designated 200, that corresponds to the memory modules 102 and 104 of FIG. 1. Each module 200 includes a substrate 202 having a front face 204 that mounts a plurality of memory devices 206. In some embodiments, the memory devices may organized as "ranks". Typically, a rank corresponds to a set of otherwise separately addressable memory devices used for a single memory access. Thus, for the example shown in FIG. 2, the memory devices are organized into a single rank 208, and operate in parallel for a given memory operation. Each memory device 206 may be realized as a single memory chip, or packaged to include plural memory die 210 in a stacked configuration (shown in phantom). In some embodiments, an additional set of memory devices may be mounted on the back face of the module, and organized as an additional rank. The memory devices each may include multiple "banks," and all of the banks organized within a given rank of devices. Each bank may be independently accessed via a given bank address.

Further referring to FIG. 2, for one embodiment, each group of plural memory die 210 couples to a data buffer 212 via a secondary data bus 216. The data buffer 212, in turn, interfaces with a memory controller (not shown) through a primary bus data 220. A command/address (C/A) buffer 222 interfaces with the memory controller through a primary command bus 224, and routes command signals along a secondary command bus 226, to the memory devices 206 in, for example, a "fly-by" manner. A unidirectional buffer communications (BCOM) bus 228 links the C/A buffer circuit 222 to the data buffers 212. For one embodiment, the memory module employs a single C/A buffer 222 embodied as a first integrated circuit (IC) buffer chip, and plural data buffer IC chips 212. The plural data buffer chips may be configured to each support a x8 (byte) portion of the primary and secondary data busses, and corresponding to a dedicated group of the memory devices 206. While separate buffer circuits are shown in FIG. 1 for the data and CA buffer circuits, the buffer circuitry may take many different forms, including, for example, a single buffer chip for each memory module that includes both the C/A and data buffer circuitry.

Figure 3:
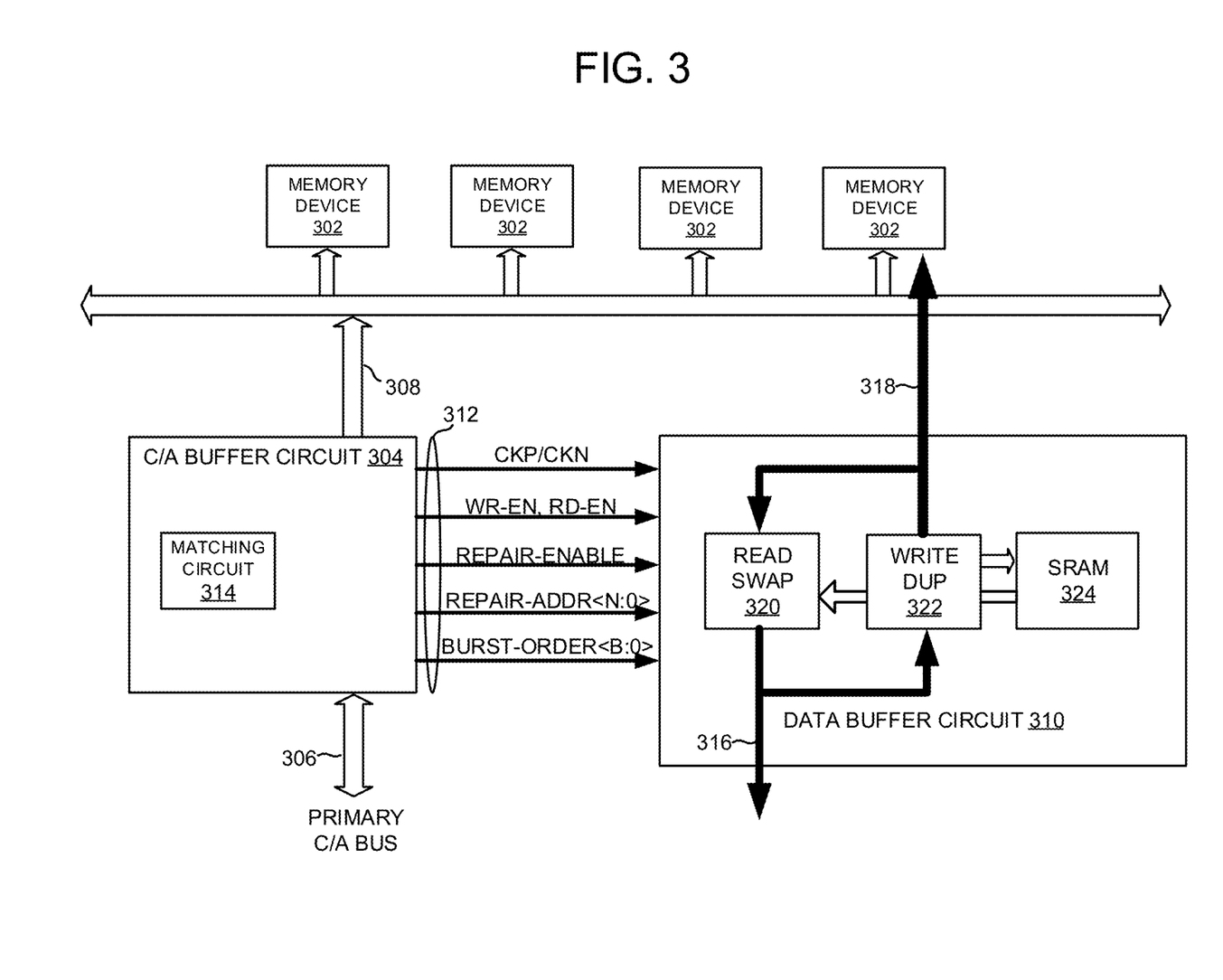
FIG. 3 illustrates an embodiment of a buffer circuit for use with the memory module of FIG. 2, and further detail associated with specific embodiments of respective data and control/address circuits employed in the buffer.

Referring now to FIG. 3, further details for one embodiment of a buffer circuit 300 for carrying out repair operations for plural memory devices 302 is shown. The buffer circuit includes a C/A buffer circuit 304 that receives C/A information from a memory controller (not shown) via a primary C/A bus 306, and passes the C/A information to the memory devices 302 via a secondary C/A bus 308. The C/A buffer circuit 304 interfaces with plural data buffer circuits 310 via a BCOM bus 312. The C/A buffer circuit 304 includes a matching circuit 314 that, in one embodiment, includes a content addressable memory (CAM) or functional equivalent such as a tag memory. The matching circuit 314 generally monitors the incoming address information received from the primary C/A bus 306 to detect data transfer operations to and from addresses of known failure locations in the memory devices 302. Further details regarding specific embodiments of the C/A buffer circuit are described below with respect to FIGS. 4 to 9.

With continued reference to FIG. 3, each data buffer circuit 310 interfaces with the memory controller via a primary data bus 316, and with the memory devices via a secondary data bus 318. The data buffer circuit 310 includes circuitry to, among other things, carry out read swap and write duplicate functions via functional blocks 320 and 322. The data buffer circuit also employs SRAM storage 324 coupled to provide substitute storage for known failure locations in one or more of the memory devices 302. Further details of embodiments of a data buffer circuit 310 are described below, with respect to FIGS. 10 and 11.

Further referring to FIG. 3, the BCOM bus 312 includes various unidirectional signal paths to enable the C/A buffer circuit 304 to communicate error information to each data buffer circuit 310. The communicated error information may include clock signals CKP/CKN for synchronization purposes, respective write and read enable signals WR-EN, RD-EN, a repair enable signal REPAIR-ENABLE, and respective repair address REPAIR-ADDR and burst order BURST-ORDER signals. Note that these signals can be electrically separate as shown in FIG. 3, or they can be packetized into a group of shared signals as is well known in the art of memory controllers and memory subsystems.

Figure 4:
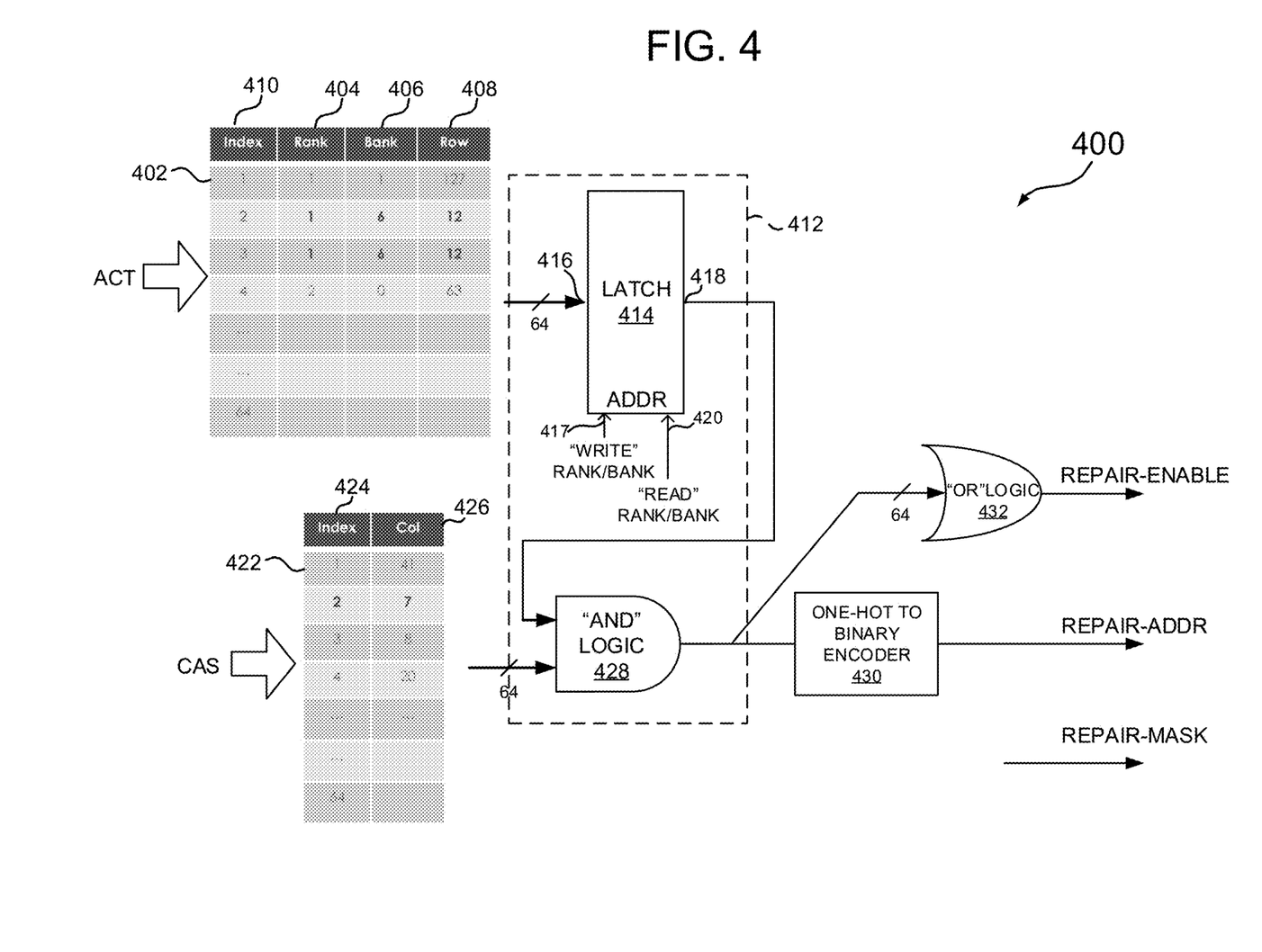
FIG. 4 illustrates one embodiment of a C/A buffer circuit for use with the buffer circuit of FIG. 3.

FIG. 4 provides one specific embodiment of a C/A buffer circuit, generally designated 400. The C/A buffer circuit includes a first match circuit 402 in the form of a first content addressable memory (CAM). The first CAM may generally be used as "associated storage" that compares input data against a table of stored data, and returns either a "miss" signal (indicating no match) or the address of the matching data. Thus, the CAM generally includes storage (not shown) to store a sequence of bits, and compare logic (not shown) to compare an input search string to all of the stored sequences. In many instances, the input search string may be truncated, such that multiple matches exist in the stored sequences.

For one specific embodiment, the first CAM 402 may be organized to receive DRAM Activate (ACT) commands that include DRAM rank, bank and row address information. Entries in the first CAM (here, 64 entries are shown, but the number may be more or less depending on available storage resources) may store DRAM rank, bank and row addresses of known memory device failure locations at respective fields 404, 406, and 408. A index field, at 410, for each entry indicates the CAM's output address information when an input matches one or more of the stored CAM entries (e.g., if an input matches the value stored at index=3, then the $3^{rd}$ output signal will be asserted). For some embodiments, a first-in-first-out (FIFO) circuit may receive multiple ACT commands in sequence, thus delaying the ACT command processing by a programmable period before receipt by the first CAM 402.

Further referring to FIG. 4, in the event an input search string matches to one or more stored entries, the "match" outputs for each of the first CAM entries (for this example, 64 outputs) are fed to gating logic 412. The gating logic includes a latch 414, such as SRAM storage, where the states of the sequence of 64 bits formed by the match signals are temporarily maintained. The latch includes storage that is organized into addresses that correspond to a rank/bank address. A particular entry may thus be accessed by a rank/bank control signal. For one embodiment, the latch 414 is a dual port SRAM, where the first port, at 416, receives and writes into storage the output from the first CAM 402 in response to a "write" rank/bank control signal, at 417, and the second port, at 418, reads from storage and outputs a prior-stored 64-bit state bitmask in response to specified "read" rank/bank control signal, at 420.

With continued reference to FIG. 4, the C/A buffer circuit 400 includes a second match circuit 422 in the form of a second CAM to receive rank, bank, and column address information from a column address strobe (CAS) signal. The second CAM 422 may be organized similarly to the first CAM 402, but with index fields, at 424, and column address fields, at 426. The output from the second CAM 422 takes the form of a 64-bit bitmask similar to the first CAM output, and indicates which entries in the second CAM 422 relate to the matched row of the first CAM 402.

Further referring to FIG. 4, the 64-bit bitmask from the second port 418 of the latch 414, accessed using the rank/bank information associated with the CAS command, and the 64-bit bitmask from the second CAM 422 are fed to AND logic 428, where the information is gated and combined to generate either an all-zero (in the case of no repairs) or one-hot (in the case of an active repair) encoding of a repair address. The one-hot encoding may then be encoded by a one-hot-to-binary encoder 430. The encoder generates repair address information identifying a repair address REPAIR-ADDR of substitute storage associated with the given data transfer. The output of the AND logic 428 may also be fed to OR logic 432, which distinguishes between either all-zero or one-hot in order to generate a repair enable signal REPAIR-ENABLE. The end result is a matching entry (if one exists for that cycle of address information) of a substitute repair address in the data buffer circuit SRAM (not shown) corresponding to a complete rank, bank, row, and column address of an incoming address. Incoming write data or desired read data originally associated with the failed DRAM address may be appropriately steered to the corresponding substitute address, and appropriately written or retrieved via the read swap/write duplicate functional blocks (FIG. 3).

Figure 5:
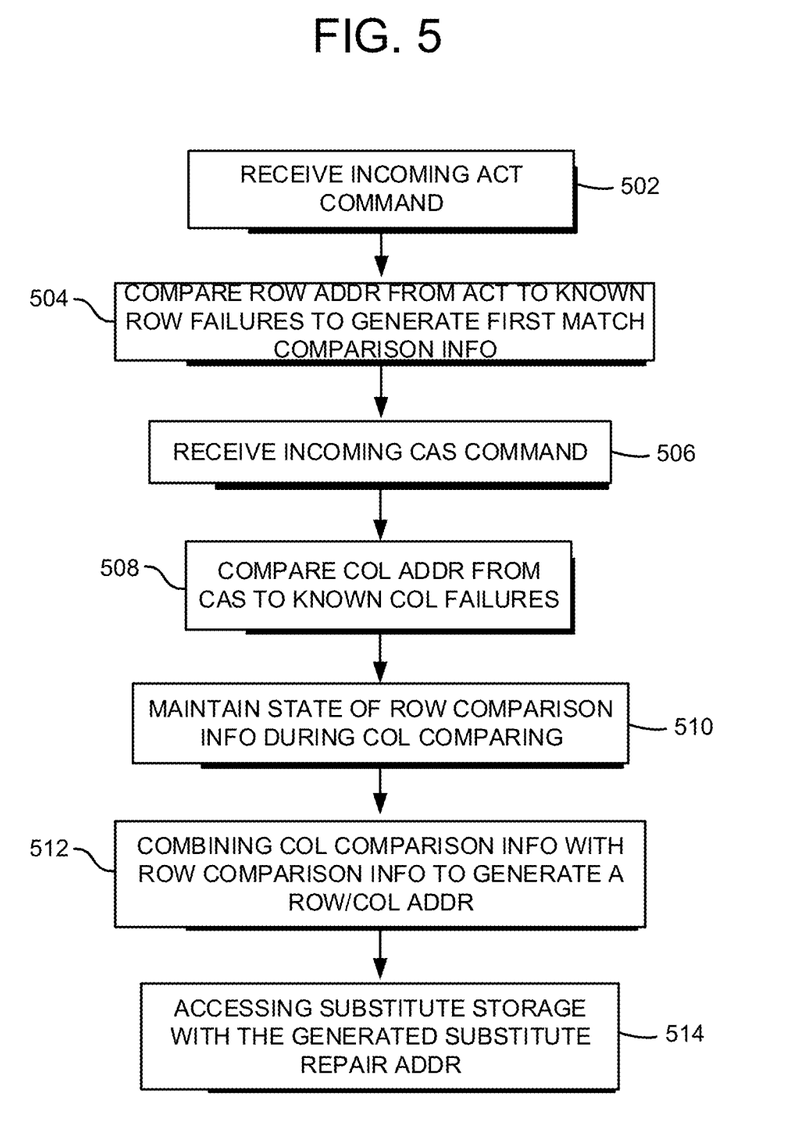
FIG. 5 illustrates a flowchart of steps for one embodiment of a DRAM repair method carried out by the C/A buffer circuit of FIG. 4.

FIG. 5 sets forth a method of operation consistent with the hardware described above regarding the C/A buffer circuit 400 of FIG. 4. Prior to normal operation, the memory system typically undertakes an initialization process. The initialization process reads or loads known failure address locations from storage, such as nonvolatile storage (not shown), programmed at manufacture, and may also identify failures identified through update operations during normal operation. The known failure information thus forms the basis for the CAM storage entries described above.

Further referring to FIG. 5, during normal operation, at step 502, an ACT command is received by the first matching circuit. As explained above, the ACT command includes rank, bank, and row address information corresponding to data involved in a given data transfer operation. It does not generally include column address information. The input sequence of bits fed to the first CAM is then compared via the CAM comparison circuitry, at step 504, to identify any matches between the input rank/bank/row address sequence to known failure rank/bank/row sequences in the programmed CAM entries. One or more matches between the input sequence and the stored sequences that are detected by the CAM may be indicated as logical "1"s in the comparison output. In many instances, there may be more than one match. If there are no known failures corresponding to the input address sequence, there will be no matching information.

With continued reference to FIG. 5, the second matching circuit receives the CAS command in a similar manner as the first matching circuit, at step 506. Like the ACT command, it includes rank/bank information about the CAS access, but unlike the ACT command, the CAS command does not include row address information, but instead includes the column address information for the given data transfer corresponding to the previously received ACT command. The timing relationship between the CAS command and the ACT command may be predictable by a known minimum latency interval. At step 508, the column address information from the CAS command is compared to the known column failures programmed into the second matching circuit. Note that the programming of known addresses into the first and second matching circuits may be correlated such that the various index entries correspond between matching circuits.

To tolerate the highly variable latency interval between receipt of the ACT command and the time associated with the propagation and matching of the CAS column information, at step 510, the states of the first matching circuit's comparison output are maintained in the latch. Upon receipt of a rank/bank signals that accompany the CAS command, the appropriate bitmask of rank/bank/row information is read from the latch and fed to the AND logic. At the same time, the bitmask of column information is also fed to the AND logic. In the event the bitmasks reflect failure information, the two bitmasks are then gated, combined, and encoded, at step 512, to generate a substitute address location. Substitute storage at the generated address may then be accessed to carry out the given data transfer, at step 514.

Figure 6:
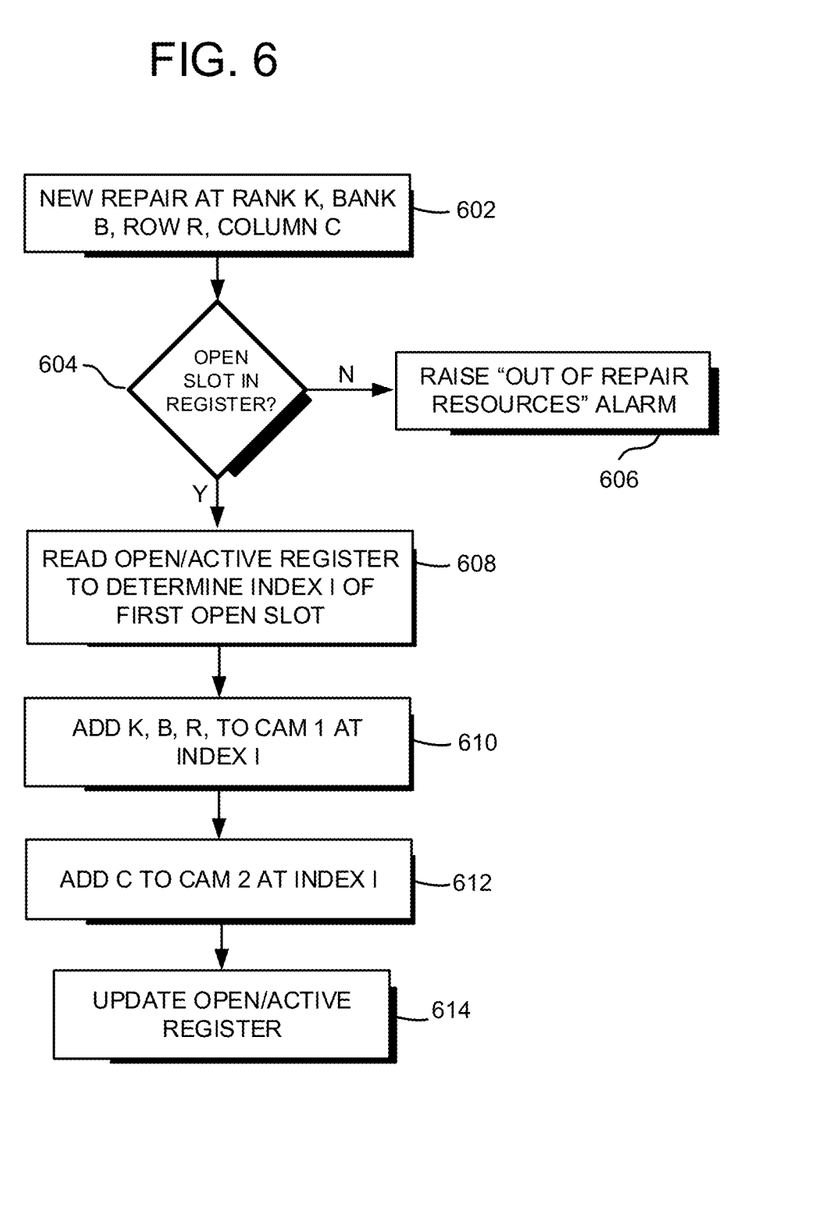
FIG. 6 illustrates a flowchart of steps for one embodiment of an update process for use with the C/A buffer circuit of FIG. 4.

FIG. 6 sets forth a high-level method for updating the first and second CAM entries to provide adaptive repair capabilities. Generally, assuming that the memory system incorporates a form of error code detection and/or correction (EDC) capability, as errors in the retrieved data are detected during normal read operations, the addresses of the corresponding new failure locations (such as through appropriate error syndromes) are logged, in terms of rank "K", bank "B", row "R" and column "C" addresses. As new errors/repairs are identified, at step 602, the C/A buffer circuit evaluates whether repair resources are available, in terms of open storage location slots, at 604. If all repair resources are utilized, then an "out of repair resources" alarm is communicated to the buffer circuitry, at step 606, to halt any further updating of the matching circuits during normal operation.

Further referring to FIG. 6, should repair resources be available, at 604, the register or storage programmed with the available resource information is read, at step 608, to determine an index entry "I" for the first available slot in both the first and second matching circuits. At step 610, the newly identified rank "K", bank "B" and row "R" address corresponding to the new failure is programmed into the first matching circuit at index "I." In a corresponding manner, the second match circuit is programmed, at step 612, with the new column failure address "C", also at index "I." The register may then be updated with the new failure address information, at 614.

Figure 7:
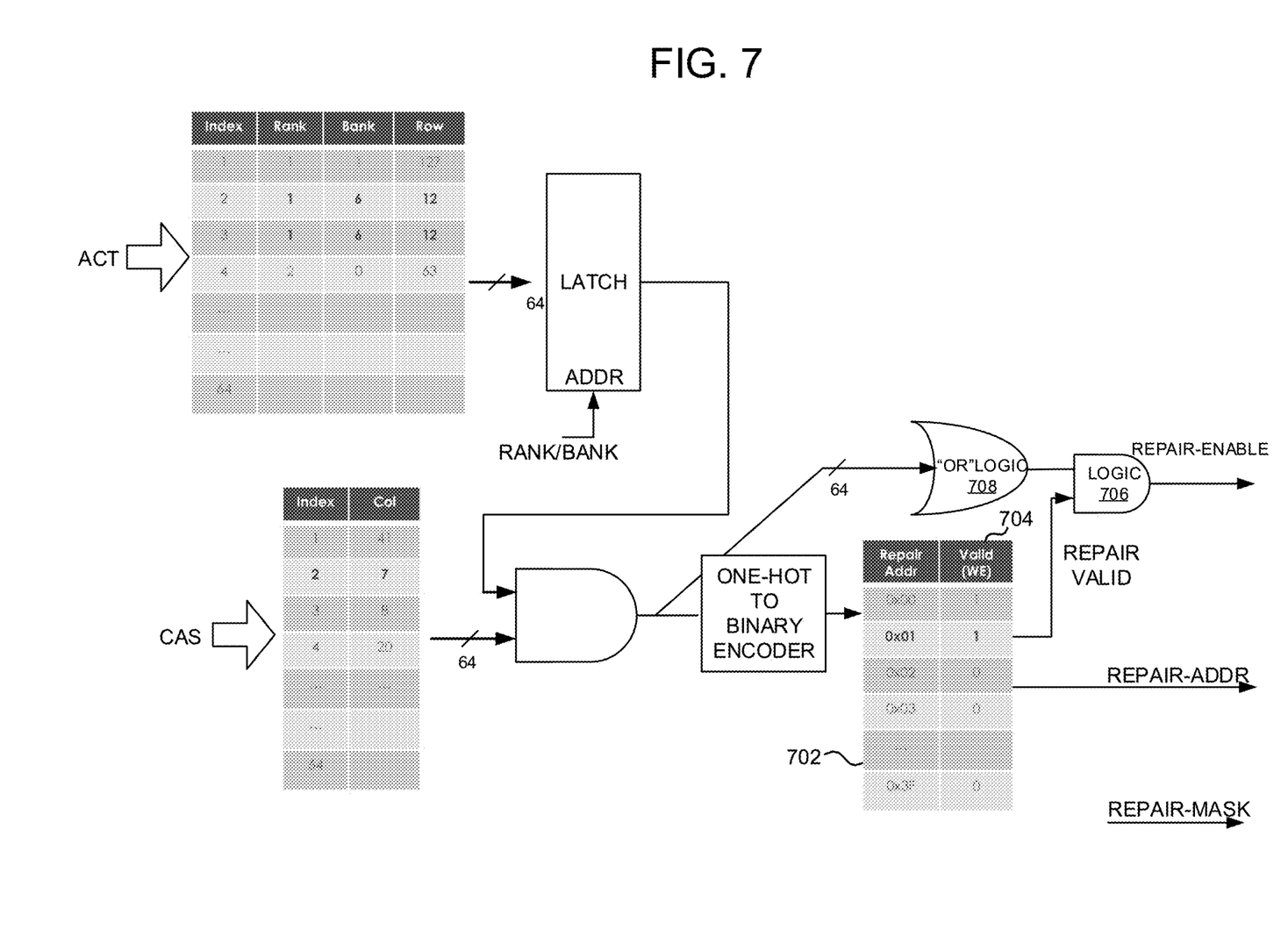
FIGS. 7-9 illustrate further embodiments of a C/A buffer circuit similar to the buffer circuit of FIG. 3.

FIG. 7 illustrates a further embodiment of a C/A buffer circuit that includes much of the circuitry, and operates similarly, to the circuit illustrated in FIG. 4. The embodiment includes storage that monitors the repair address locations, at 702, and tracks whether or not data has actually been written to the repair location. A write operation to the repair location (e.g., when a write enable (WE, at 704) bit accompanies a CAS command) results in a valid bit being set for the repair address, at 704. Subsequent read operations to the given repair address are gated by logic 706 that receives the valid bit and the output of OR logic 708 (which generates the repair enable signal REPAIR ENABLE). Thus, access to the repair resource is based on whether the valid bit is a logic "1" or not. This ensures that the repair address location is not used for repairing read data until correct data is actually written to it.

Figure 8:
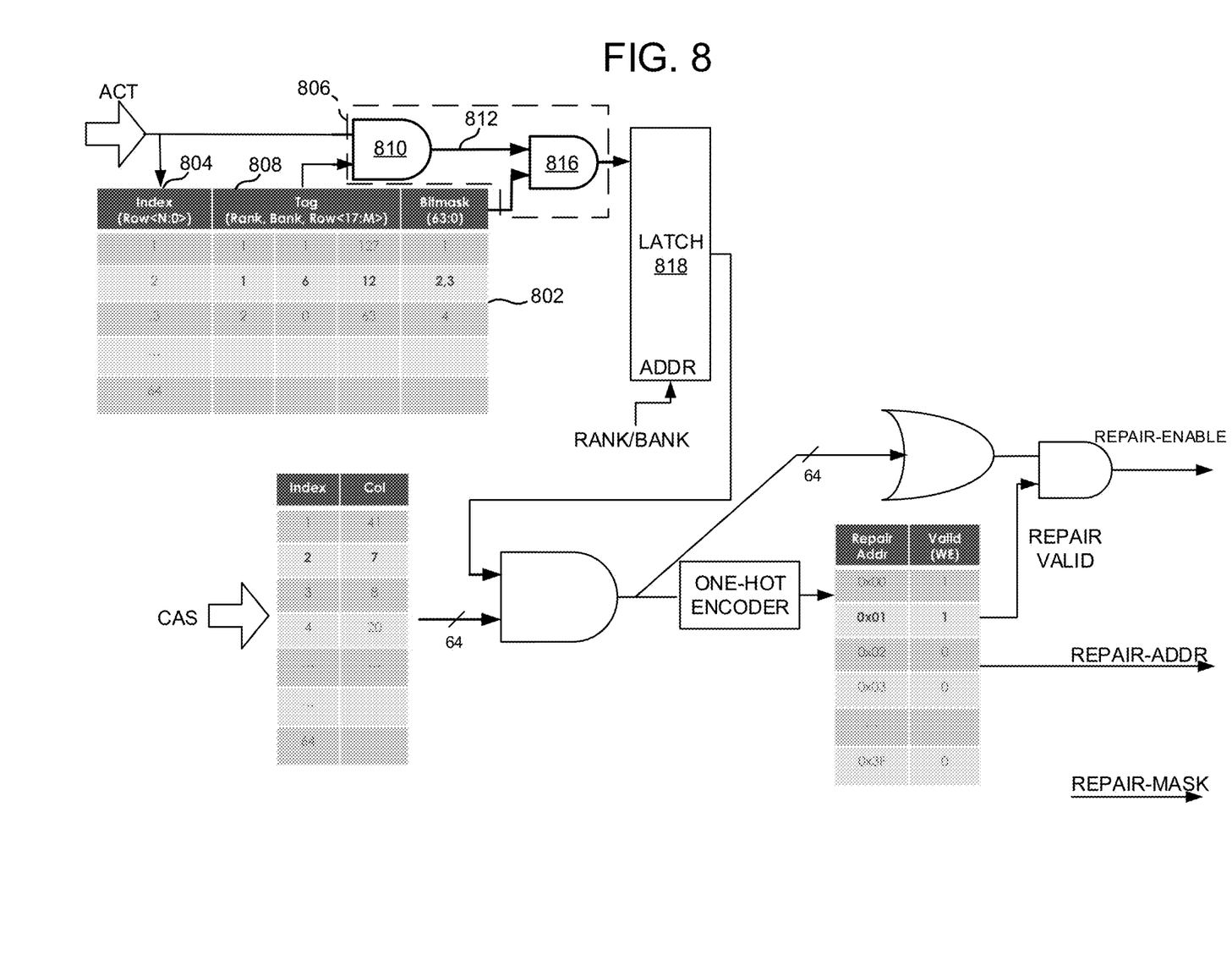

FIG. 8 illustrates a further embodiment of the C/A buffer circuit, similar to that shown in FIG. 7, with the first matching circuit taking the form of a direct mapped tag RAM 802. A tag RAM is often used to specify which of a set of possible memory locations is currently stored in a cache. A given activate command ACT is received by the tag RAM, at 804, and multi-stage AND logic 806 first combines the ACT address information with tag information retrieved from a tag field, at 808 with a first logic gate, at 810. The output is further combined, at 812, with a generated bitmask from a bitmask field 814, at 816. The combined output is then latched by latch 818, and processed similarly to the previously described embodiments of FIGS. 4-7 to generate a substitute repair address.

Figure 9:
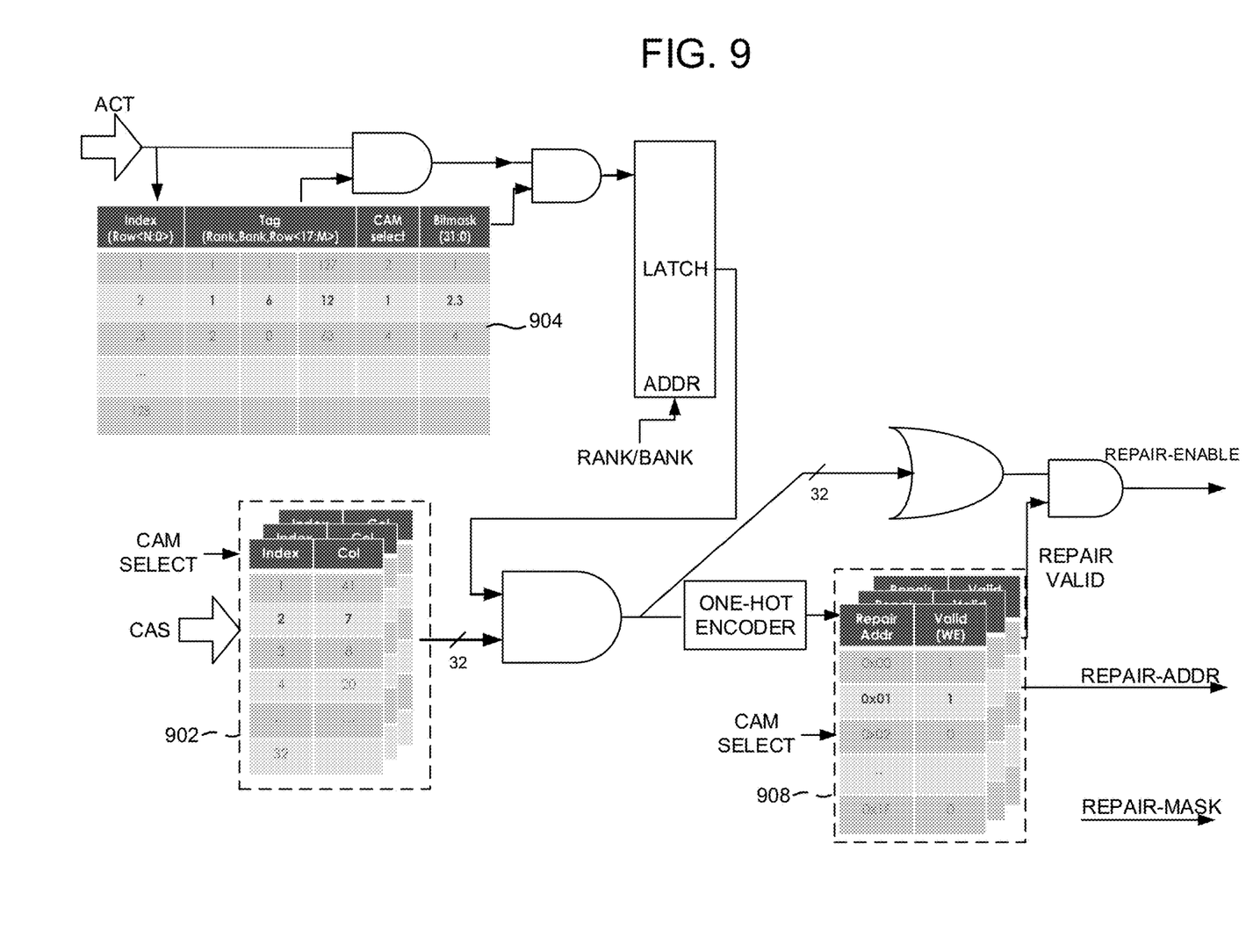

An additional embodiment of the C/A buffer circuit is shown in FIG. 9, which includes much of the circuitry of FIG. 8, but with plural second matching circuits 902 to support a larger number of entries in the tag RAM 904. For one embodiment, the second matching circuits are respective CAMs that are responsive to a CAM select signal, at 906. The CAM select value may be stored by the tag RAM 904. Each CAM may include, for example, a number of entries such that the aggregate number of entries of the second match circuit 902 is consistent with the total number of entries in the tag RAM 904. Valid bit storage 908 may also employ storage, such as multiple RAMs, which is also responsive to the CAM select signal.

Figure 10:
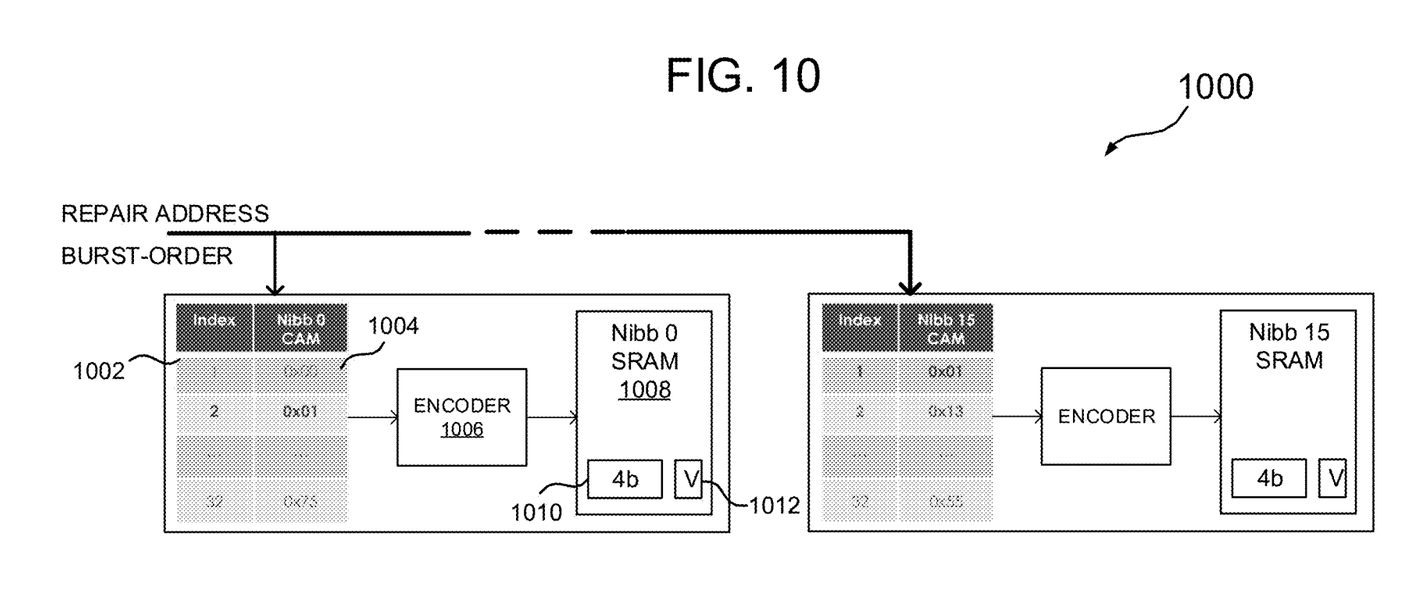
FIG. 10 illustrates one embodiment of a data buffer circuit for use with the buffer circuit of FIG. 3.

FIG. 10 illustrates one specific embodiment of a data buffer circuit, generally designated 1000. As noted above, for one embodiment, the repair storage resources for the buffer circuit reside in the data buffer circuits in the form of SRAM. Generally, in some embodiments, each data buffer circuit is dedicated to supporting a "byte" (eight bits) of data paths to the memory devices. For some embodiments, a corresponding repair for a given transaction amounts to a column of data that may involve up to 576 storage locations (i.e., 9 bytes, with 64 data bits per byte per access). In some situations, however, the amount of SRAM to support the repairs may be less than optimal, especially if there is only a single faulty bit in a column access (i.e., 576 storage locations to repair a single faulty bit). The embodiment shown in FIG. 10 provides for a more efficient usage of SRAM resources to support repairs at the sub-burst level instead of at the column burst level of granularity. Having this flexibility allows for a repair at a specific byte, nibble or bit in the transfer burst.

Further referring to FIG. 10, each data buffer circuit 1000 includes storage 1002, such as a CAM. The CAM provides a number of entries, such as thirty-two, to store known repair address locations, at 1004, that are compared to incoming generated repair addresses from the C/A buffer circuit. A matching output is fed to a one-hot-to-binary encoder 1006, with the encoded result sent to a sub-array of SRAM, at 1008. The SRAM may be organized such that each of thirty-two entries (matching the CAM entries) provides substitute storage to store a sub-burst of data, such as a nibble (4-bits) of data, at 1010. A valid bit storage location for each entry is also provided, at 1012. The valid bit is enabled after a first write operation takes place at the given entry. Repair memory read accesses from the given SRAM entry are not performed until the valid bit is enabled. Note that in such an embodiment, where the data buffer tracks the valid bit, the C/A buffer no longer needs to track the valid bit status, which simplifies its functionality. For one specific embodiment, sixteen data buffer circuits are provided, each having a x4 interface, and each with a dedicated CAM and SRAM resource. Note also that the BURST-ORDER information received on the BCOM bus from the C/A buffer is provided so that the burst order of the SRAM repair memory behaves in the same way as the DRAMs being repaired.

Figure 11:
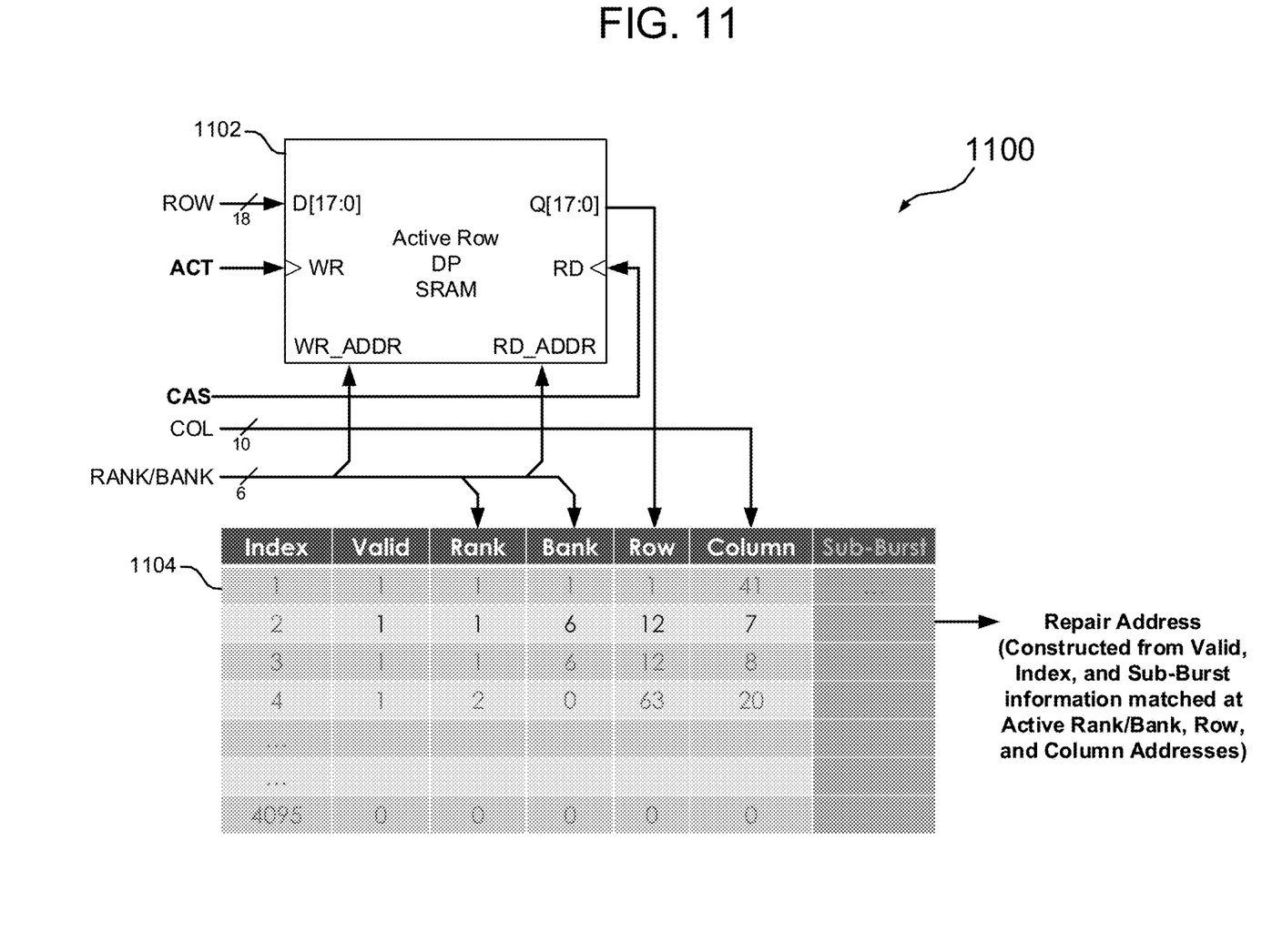
FIG. 11 illustrates an additional embodiment similar to that shown in FIG. 4.

FIG. 11 illustrates a further embodiment of a C/A buffer circuit, generally designated 1100. In some situations, there may be an unknown latency between specific rank/bank/row ACT and column CAS commands. There may even be intervening ACT commands to other rank/banks. The C/A buffer circuit 1100 includes an active row dual port SRAM 1102 and a single fault repair address CAM 1104. The SRAM decouples the ACT and CAS commands by latching the per-rank, bank row address during ACT commands, and reading out the rank, bank specific active row address during the CAS command. Once the entire address has been acquired by the SRAM in two stages, it is then compared against the contents of the CAM 1104 in a single match operation, using the index of a valid matched address to create a repair address that can be forwarded to the data buffer circuits (not shown).

A further variation of the C/A buffer circuit 1100 may employ logic, similar to that shown in FIG. 4, to write a single "valid match" bit into a latch at a specified write rank/bank address. During CAS cycles, the latch may be read from the read rank/bank address that accompanies the column address that performs a second comparison, and qualifies the column match. The read rank/bank address can then be used in conjunction with a CAS CAM index to generate a repair address.

Those skilled in the art will appreciate that the embodiments described above provide adaptive in situ repair capabilities for buffered memory systems. Utilizing multiple match circuits in the C/A buffer circuit provides an efficient repair search capability for incoming addresses that minimizes the amount of CAM/tag storage in the C/A buffer circuit. Additionally, by repairing failed storage locations at the nibble level, on-die SRAM in the data buffer circuits may be minimized while still providing sufficient repair capabilities.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. A data buffer integrated circuit (IC) chip, comprising:
   a primary data interface for coupling to a memory controller, the primary data interface to transfer data with the memory controller for a given data transfer operation;
   a secondary interface for coupling to at least one memory device;
   on-chip memory having substitute storage locations to store data for known failure locations of the at least one memory device; and
   match circuitry to access the substitute storage locations based on a match of incoming failure address information to the known failure locations.

2. The data buffer IC chip according to claim 1, wherein ones of the substitute storage locations are configured to store a sub-burst of data bits.

3. The data buffer IC chip according to claim 2, wherein the sub-burst of data bits comprises a nibble of data bits.

4. The data buffer IC chip according to claim 2, wherein the on-chip memory is further configured to store a state bit for each of the substitute storage locations, the state bit indicating whether or not a corresponding substitute storage location has been accessed by a prior write operation; and
   wherein a read access to a given substitute storage location is constrained based on the value of a given state bit corresponding to the given substitute storage location.

5. The data buffer IC chip according to claim 1, wherein the on-chip memory comprises static random access memory (SRAM) memory.

6. The data buffer IC chip according to claim 5, further comprising:
   a broadcast communications (BCOM) interface to receive the incoming failure address information from a command/address (C/A) buffer integrated circuit chip.

7. The data buffer IC chip according to claim 6, wherein the match circuitry comprises:
  a content-addressable memory (CAM) to compare the incoming failure address information from the C/A buffer IC chip to known failure addresses stored in respective CAM entries, wherein a match condition for a given one of the respective CAM entries generates a signal to access a storage location of the on-chip memory corresponding to the matching failure address entry of the CAM.

8. A buffer chipset for a memory module, comprising:
  a command/address (C/A) buffer integrated circuit (IC) chip having a primary C/A interface for coupling to a memory controller, and a secondary C/A interface for coupling to at least one memory device, the C/A buffer IC chip to generate failure address locations in the at least one memory device;
  at least one data buffer IC chip to receive the failure address locations from the C/A buffer IC chip, wherein the at least one data buffer IC chip comprises
    a primary data interface for coupling to a memory controller, the primary data interface to transfer data with the memory controller for a given data transfer operation;
    a secondary interface for coupling to the at least one memory device;
    on-chip memory having substitute storage locations to store data for the failure address locations of the at least one memory device; and
    match circuitry to access the substitute storage locations for data transfers associated with the failure address locations.

9. The buffer chipset of claim 8, wherein ones of the substitute storage locations are configured to store a sub-burst of data bits.

10. The buffer chipset of claim 9, wherein the sub-burst of data bits comprises a nibble of data bits.

11. The buffer chipset of claim 9, wherein the on-chip memory is further configured to store a state bit for each of the substitute storage locations, the state bit indicating whether or not a corresponding substitute storage location has been accessed by a prior write operation; and
  wherein a read access to a given substitute storage location is constrained based on the value of a given state bit corresponding to the given substitute storage location.

12. The buffer chipset of claim 8, wherein the on-chip memory comprises static random access memory (SRAM) memory.

13. The buffer chipset of claim 12, further comprising:
  a broadcast communications (BCOM) interface to receive failure address information from a command/address (C/A) buffer integrated circuit chip.

14. The buffer chipset of claim 13, wherein the match circuitry comprises:
  a content-addressable memory (CAM) to compare the received failure address information from the C/A buffer IC chip to known failure addresses stored in respective CAM entries, wherein a match condition for a given one of the respective CAM entries generates a signal to access a storage location of the on-chip memory corresponding to the matching failure address entry of the CAM.

15. A memory module comprising:
  a substrate;
  multiple memory devices disposed on the substrate; and
  buffer circuitry disposed on the substrate and coupled to the memory devices, the buffer circuitry comprising
    a primary data interface for coupling to a memory controller, the primary data interface to transfer data with the memory controller for a given data transfer operation;
    a secondary interface for coupling to the multiple memory devices;
    on-chip memory having substitute storage locations to store data for failure address locations of at least one of the multiple memory devices; and
    match circuitry to access the substitute storage locations for data transfers associated with the failure address locations.

16. The memory module according to claim 15, wherein the buffer circuitry comprises:
  at least one data buffer integrated circuit (IC) chip.

17. The memory module according to claim 15, further comprising:
  a command/address (C/A) buffer IC chip coupled to the at least one data buffer IC chip via a broadcast communications (BCOM) bus, the command/address (C/A) buffer integrated circuit (IC) chip having a primary C/A interface for coupling to a memory controller, and a secondary C/A interface for coupling to at least one memory device, the C/A buffer IC chip to generate failure address locations in the at least one memory device.

18. The memory module according to claim 15, wherein ones of the substitute storage locations are configured to store a sub-burst of data bits.

19. The memory module according to claim 18, wherein the sub-burst of data bits comprises a nibble of data bits.

20. The memory module according to claim 18, wherein the on-chip memory is further configured to store a state bit for each of the substitute storage locations, the state bit indicating whether or not a corresponding substitute storage location has been accessed by a prior write operation; and
  wherein a read access to a given substitute storage location is constrained based on the value of a given state bit corresponding to the given substitute storage location.

* * * * *